(12) United States Patent
Lysacek et al.

(10) Patent No.: US 7,737,004 B2
(45) Date of Patent: Jun. 15, 2010

(54) MULTILAYER GETTERING STRUCTURE FOR SEMICONDUCTOR DEVICE AND METHOD

(75) Inventors: David Lysacek, Vidce (CZ); Michal Lorenc, Frydek-Mistek (CZ); Lukas Valek, Fulnek (CZ)

(73) Assignee: Semiconductor Components Industries LLC, Phoenix, AZ (US)

( * ) Notice: Subject to any disclaimer, the term of this patent is extended or adjusted under 35 U.S.C. 154(b) by 454 days.

(21) Appl. No.: 11/482,237

(22) Filed: Jul. 3, 2006

(65) Prior Publication Data

US 2008/0003782 A1 Jan. 3, 2008

(51) Int. Cl.
*H01L 21/322* (2006.01)

(52) U.S. Cl. ............... 438/476; 438/310; 438/471; 257/E21.318; 257/E29.108

(58) Field of Classification Search ............ 438/471, 438/310, 476; 257/E21.318, E29.108
See application file for complete search history.

(56) References Cited

U.S. PATENT DOCUMENTS

| | | | |
|---|---|---|---|
| 4,053,335 A | 10/1977 | Hu | |
| 4,559,086 A | 12/1985 | Hawkins | |
| 4,608,096 A | 8/1986 | Hill | |
| 4,645,546 A | 2/1987 | Matsushita | |
| 4,698,900 A | 10/1987 | Esquivel | |
| 4,892,840 A | 1/1990 | Esquivel | |
| 5,008,722 A | 4/1991 | Esquivel | |
| 5,397,903 A | 3/1995 | Hirose | |
| 5,444,001 A * | 8/1995 | Tokuyama | 438/402 |
| 5,753,560 A | 5/1998 | Hong | |
| 5,757,063 A | 5/1998 | Tomita | |
| 5,784,167 A * | 7/1998 | Ho | 356/369 |
| 5,874,325 A * | 2/1999 | Koike | 438/143 |
| 5,882,990 A * | 3/1999 | DeBusk et al. | 438/476 |
| 5,895,236 A * | 4/1999 | Yaoita | 438/143 |
| 6,146,980 A * | 11/2000 | Hsu | 438/471 |
| 6,277,194 B1 * | 8/2001 | Thilderkvist et al. | 117/94 |
| 6,376,336 B1 * | 4/2002 | Buynoski | 438/476 |
| 6,482,749 B1 * | 11/2002 | Billington et al. | 438/745 |
| 6,531,378 B2 | 3/2003 | Hopfner | |
| 6,639,327 B2 | 10/2003 | Momoi | |
| 6,670,259 B1 * | 12/2003 | Chan | 438/473 |
| 6,890,838 B2 | 5/2005 | Henley | |
| 2006/0008997 A1 * | 1/2006 | Jang et al. | 438/287 |
| 2007/0010037 A1 * | 1/2007 | Li et al. | 438/29 |

FOREIGN PATENT DOCUMENTS

JP 60176241 9/1985

OTHER PUBLICATIONS

Ibok, E., Garg, S., A Characterization of the Effect of Deposition Temperature on Polysilicon Properties, J. Electrochem. Soc., vol. 140, No. 10, Oct. 1993, p. 2933.

Istratov, A., Vainola, H., Huber, W., Weber, E., Gettering in silicon-on-insulator wafers: experimental studies and modelling, Semiconductor Science Technology 20 (2005) 568-575.

Kamins, T. I., Manoliu, J., Tucker, R. N., Diffusion of Impurities in Polycrystalline Silicon, J. Appl. Phys., vol. 43, No. 1, Jan. 1972.

Meakin, D., Stoemenos, J., Migliorato, P., Economou, N. A., Structural studies of low-temperature low-pressure chemical deposited polycrystalline silicon, J. Appl. Phys., vol. 61(11), Jun. 1987.

\* cited by examiner

*Primary Examiner*—Thao X Le
*Assistant Examiner*—Eric W Jones
(74) *Attorney, Agent, or Firm*—Kevin B. Jackson

(57) ABSTRACT

In one embodiment, a multi-layer extrinsic gettering structure includes plurality of polycrystalline semiconductor layers each separated by a dielectric layer.

20 Claims, 2 Drawing Sheets

MULTILAYER GETTERING STRUCTURE FOR SEMICONDUCTOR DEVICE AND METHOD

FIELD OF THE INVENTION

This invention relates generally to semiconductor devices, and more specifically to manufacturing methods that improve device performance.

BACKGROUND OF THE INVENTION

In the processing of integrated circuit (IC) devices, yield is a key economical parameter that IC manufacturers pay close attention to. Poor yielding devices impact manufacturing cycle time, resource allocation, on-time delivery, market share, and profits among other things. Excessive or high leakage current is often one parameter that causes poor yields in IC manufacturing. High leakage current is typically caused by the presence of fast diffusing impurities or defects in active device regions within a semiconductor substrate.

One known method of reducing this problem is referred to as extrinsic gettering, which is a process to remove the unwanted impurities from critical regions of IC devices and prevent formation of impurity related defects. In a typical extrinsic gettering process, a single polycrystalline semiconductor layer is deposited on the back or lower surface (i.e., the surface opposite the surface where active devices are formed) of a monocrystalline semiconductor substrate prior to any high temperature process. The presence of the polycrystalline layer induces stress on the semiconductor substrate, which acts to getter or remove the unwanted impurities during subsequent high temperature processing and prevent formation of impurity related defects. Unfortunately, during the subsequent high temperature process steps the polycrystalline silicon layer itself recrystallizes, and thus loses a significant part of its gettering capability.

Accordingly, an improved gettering structure and method are needed that address the issues associated with prior art gettering techniques including those set forth above.

BRIEF DESCRIPTION OF THE DRAWINGS

For simplicity and clarity of illustration, elements in the figures are not necessarily to scale, and the same reference numbers in different figures denote the same elements. Additionally, descriptions and details of well-known steps and elements are omitted for simplicity of the description.

DETAILED DESCRIPTION OF DRAWINGS

Figure 1:
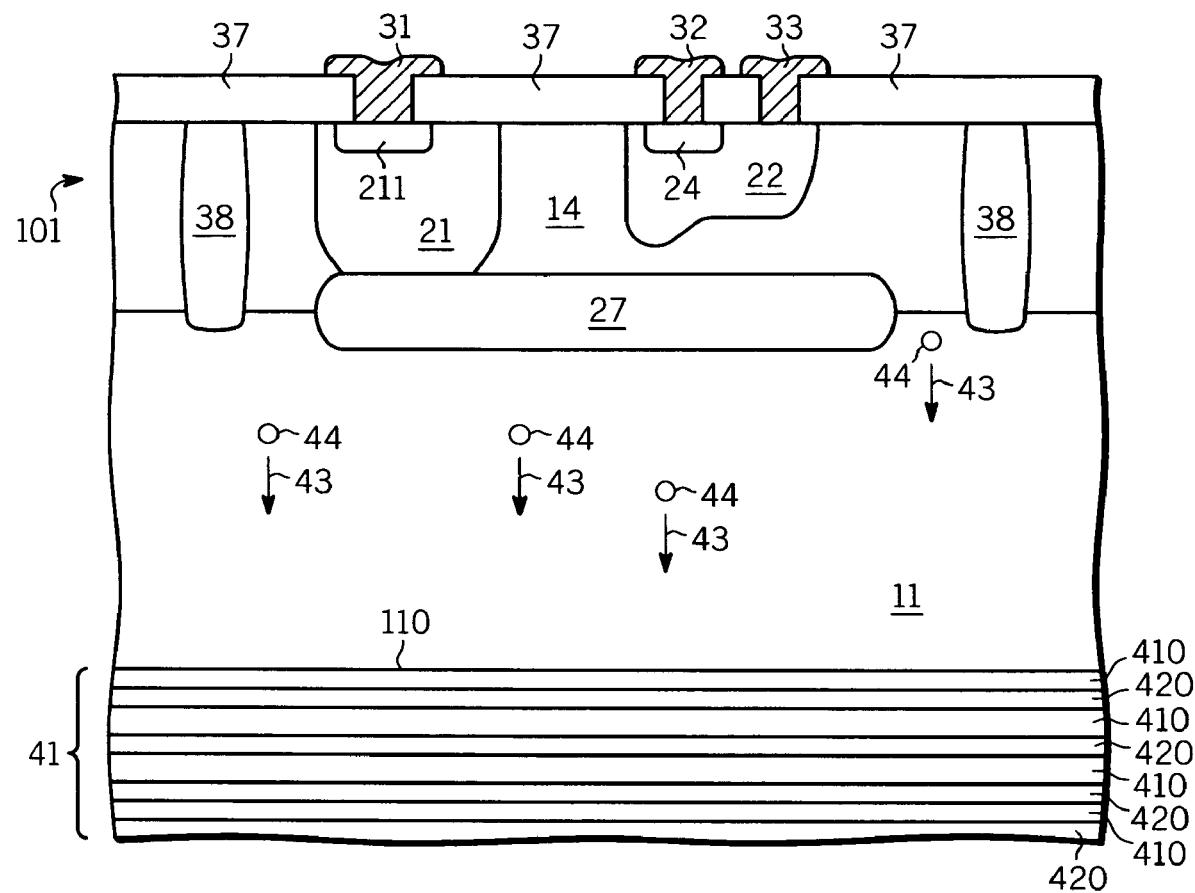
FIG. 1 illustrates an enlarged partial cross-sectional view of a semiconductor device manufactured in accordance with a first embodiment.

FIG. 1 shows an enlarged partial cross-sectional view of a semiconductor device 10 at an intermediate step in fabrication. Device 10 includes an active device portion 101, which is formed in a semiconductor layer 14 overlying a semiconductor substrate 11. By way of example, semiconductor layer 14 comprises an n-type semiconductor layer formed using conventional epitaxial growth techniques. Active device 101 is shown as an NPN bipolar transistor device, and includes an n-type collector region 21, a p-type base region 22, and an n-type emitter region 24. An n-type buried layer 27 is formed adjacent semiconductor substrate 11 and semiconductor layer 14, and functions to reduce resistance between base region 22 and collector region 21. An n-type collector contact region 211 is formed within collector region 21, and functions to reduce contact resistance to collector contact 31. Emitter contact 32 and base contact 33 contact emitter region 24 and base region 22 respectively. A dielectric layer 37 is formed overlying portions of major surface 16, and p-type diffused isolation regions 38 are formed in portions of semiconductor layer 14 to provide isolation for active device portion 101.

It is understood that active device 101 is shown as an NPN transistor for illustrative purposes only, and that the structure and method described herein is suitable for many different kinds of devices including MOSFETS, IGFETS, diodes, thyristors, PNP bipolar devices, and the like. Further, the structure and method described herein is suitable for processing discrete and/or integrated circuit devices, or is used to getter blank semiconductor wafers. In general, the structure and method described herein is suitable for any device where impurity gettering and prevention of formation of impurity related defects is desired.

A multi-layer gettering or extrinsic composite gettering structure 41 is formed on a lower, back side, or major surface 110 of semiconductor substrate 11 and includes alternating layers of a polycrystalline semiconductor material 410 and a dielectric material 420. In one embodiment, gettering structure 41 comprises a plurality of polycrystalline semiconductor layers 410 separated by a plurality of dielectric layers 420. By way of example, polycrystalline semiconductor layers 410 comprise polycrystalline silicon or polysilicon, and dielectric layers 420 comprise silicon oxide layers such as silicon dioxide. In one embodiment, structure 41 is formed at an early stage of wafer fabrication, for example prior to any high temperature processing (i.e., before any processing above about 900 degrees Celsius). It is understood that device 10 is shown as an intermediate structure because multi-layer structure 41 may be removed from semiconductor substrate 11 at a final stage of fabrication. In another embodiment, multi-layer structure 41 remains in the final device.

As shown in FIG. 1, structure 41 functions to getter (designated generally by arrows 43) unwanted impurities 44 including, but not limited to heavy metals such as copper, nickel, and/or iron. The gettering effect of polycrystalline semiconductor layer 410 is explained in part because the solubility of heavy metals in polycrystalline semiconductor layer 410 at high temperature (greater than about 1000 degrees Celsius) is generally more than an order of magnitude higher than the solubility of the heavy metals in single crystalline silicon substrate 11.

In one embodiment when polycrystalline semiconductor layers 410 comprise polycrystalline silicon and dielectric layers 420 comprise silicon oxide (e.g., silicon dioxide), multi-layer structure 41 is formed using for example, low pressure chemical vapor deposition (LPCVD) techniques or other techniques. Polycrystalline silicon is formed for example using silane by the reaction: $SiH_4 \rightarrow Si + 2H_2$. Silicon dioxide is also formed for example using silane by the reaction: $SiH_4 + O_2 \rightarrow SiO_2 + 2H_2$. As an alternative, dielectric layers 420 are formed using TEOS ($Si(OC_2H_5)_4$) or other commonly used gases or source materials.

When the same source gas (e.g., silane) is used to form layers 410 and 420, multi-layer structure 41 is conveniently formed in one deposition system. For example, in one step a polycrystalline silicon layer 410 is deposited, and in a second step, a silicon dioxide layer 420 is deposited. These steps are repeated until the desired number of layers is formed. As an alternative method, multi-layer structure 41 is formed using separate deposition systems.

The thicknesses of polycrystalline layers 410 and dielectric layers 420 are constant throughout multi-layer structure 41, or the thicknesses vary. When the thicknesses vary, in one embodiment the thicknesses of layers 410 and 420 change gradually from a thickest layer close to or in proximity to semiconductor substrate 11 to a thinnest layer at the outermost portion of multi-layer structure 41. In another embodiment, the thicknesses of layers 410 and 420 change gradually from a thinnest layer close to or in proximity to semiconductor substrate 11 to a thickest layer at the outermost portion of multi-layer structure 41. In a further embodiment, thick and thin layers are dispersed throughout multi-layer structure 41.

In one embodiment, polycrystalline semiconductor layers 410 have thicknesses in a range from about 0.01 microns to about 0.5 microns. In one embodiment, dielectric layers 420 have thicknesses in a range from 0.002 microns to about 0.1 microns. The total number of layers 410 and 420 in multi-layer structure 41 range from at least four (4) layers or five (5) layers (e.g., 410/420/410/420 or 420/410/420/410/420) to 27 layers or more. The total thickness of multi-layer structure 41 is given by the summation of thicknesses of all deposited layers 410 and 420.

It is believed that dielectric layers 420 comprising silicon dioxide up to about 0.03 microns in thickness are responsible for averting the diffusion of slow diffusing impurities such as iron. When the benefit of this effect is important, dielectric layers 420 of silicon dioxide having this thickness are placed in proximity to the outermost surface of multi-layer structure 41 (i.e., spaced apart from major surface 110). It is further believed that dielectric layers 420 comprising silicon dioxide in this position or location may effectively prevent contamination of semiconductor substrate 11 from diffusion of contaminants into the substrate, for example when semiconductor substrate 11 is in contact with a susceptor during the epitaxial deposition of semiconductor layer 14.

It was further found through extensive experimentation that the quality of multi-layer structure 41 and its corresponding extrinsic gettering capability are dependent on the deposition or processing parameters used for forming of layers 410 and 420. In particular, process parameters such as temperature, deposition pressure and/or gas flow rates are important to consider. For example, it was found that deposition temperature directly influences the structure of the polycrystalline semiconductor layers 410 and the extrinsic gettering capability of multi-layer structure 41. It was found that a suitable deposition temperature for polycrystalline semiconductor layers 410 in multi-layer structure 41 is in the range from about 550 degrees Celsius to about 750 degrees Celsius when polycrystalline semiconductor layers 410 comprise polycrystalline silicon.

It was also found that the structure of polycrystalline semiconductor layers 410 and ultimately the extrinsic gettering capability of multi-layer structure 41 are less sensitive to pressure then to temperature. When polycrystalline semiconductor layers 410 comprise polycrystalline silicon, a deposition pressure in a range from about 5 Pascal (about 0.040 Torr) to about 80 Pascal (about 0.6 Torr) is suitable.

When polycrystalline semiconductor layers 410 comprise polycrystalline silicon, gas flow settings depend on the type of deposition equipment used. In one embodiment, the flow rate for silane is in a range from about five (5) standard cubic centimeters per minute (sccm) to about 600 sccm.

In one embodiment when dielectric layers 420 comprise silicon dioxide formed using silane, the deposition temperatures and pressures used to form polycrystalline silicon layers 410 are used to form layers 420. When different process parameters used to form layers 420, it is recommended to use a stabilization step between deposition steps. In one embodiment, the deposition temperature, pressure and silane flow rate for forming dielectric layers 420 are in the same ranges as those for the deposition of the polycrystalline silicon layers 410. By way of example, the oxygen flow rate for the formation of layers 420 is in a range from about five (5) sccm to about 200 sccm.

Figure 2:
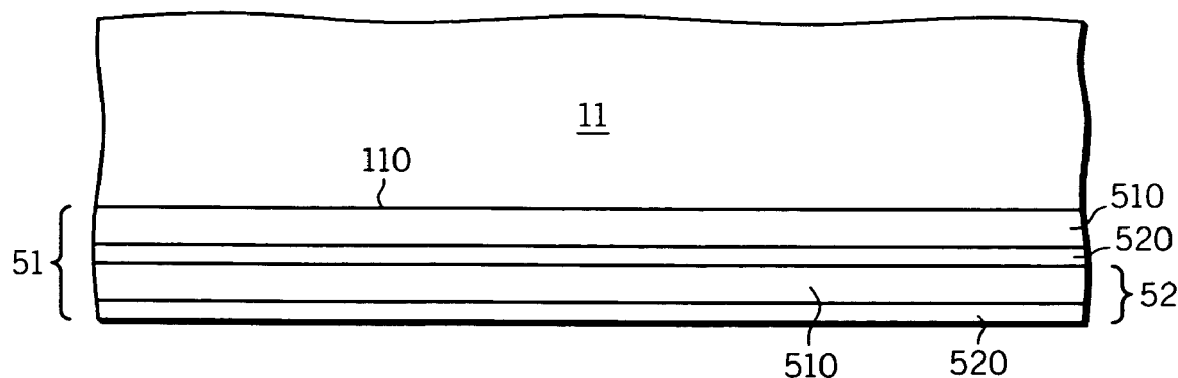
FIG. 2 illustrates an enlarged partial cross-sectional view of another embodiment.

FIG. 2 shows a partial cross-sectional view of another embodiment of a multi-layer extrinsic gettering structure 51 formed overlying a major surface 110 of semiconductor substrate 11. In this embodiment, structure 51 comprises alternating layers of polycrystalline semiconductor layers 510 and dielectric layers 520. A first polycrystalline semiconductor layer 510 adjoins or contacts major surface 110 and separates a first dielectric layer 520 from major surface 110. In one embodiment, polycrystalline semiconductor layers 510 comprise polycrystalline silicon, and have thicknesses in a range from about 0.01 microns to about 0.5 microns. In one embodiment, dielectric layers 520 comprise silicon dioxide and have thicknesses in a range from about 0.002 microns to about 0.05 microns. One layer 510 and one layer 520 form a pair of layers 52, and multi-layer structure 51 may have a total of from two (2) to fourteen (14) or more pairs of layers 52.

Figure 3:
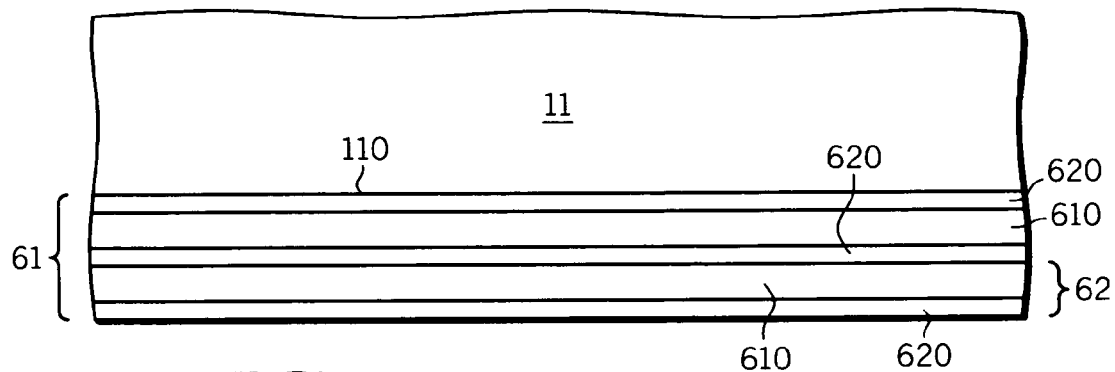
FIG. 3 illustrates an enlarged partial cross-sectional view of further embodiment.

FIG. 3 shows an enlarged partial cross-section view of a further embodiment of a multi-layer extrinsic gettering structure 61 formed overlying major surface 110 of semiconductor substrate 11. In this embodiment, multi-layer structure 61 comprises alternating layers of polycrystalline semiconductor material 610 and dielectric layers 620. A first dielectric layer 620 adjoins or contacts major surface 110 and separates a first polycrystalline semiconductor layer 610 from major surface 110. In one embodiment, dielectric layers 620 comprise silicon dioxide and have thicknesses in a range from about 0.002 microns to about 0.05 microns. In one embodiment, polycrystalline semiconductor layers 610 comprise polycrystalline silicon, and have thicknesses in range from about 0.01 microns to about 0.5 microns. One layer 610 and one layer 620 form a pair of layers 62, and multi-layer structure 61 may have a total of from two (2) to fourteen (14) or more pairs of layers 62. In one embodiment, a dielectric layer 620 is the outermost layer.

Figure 4:
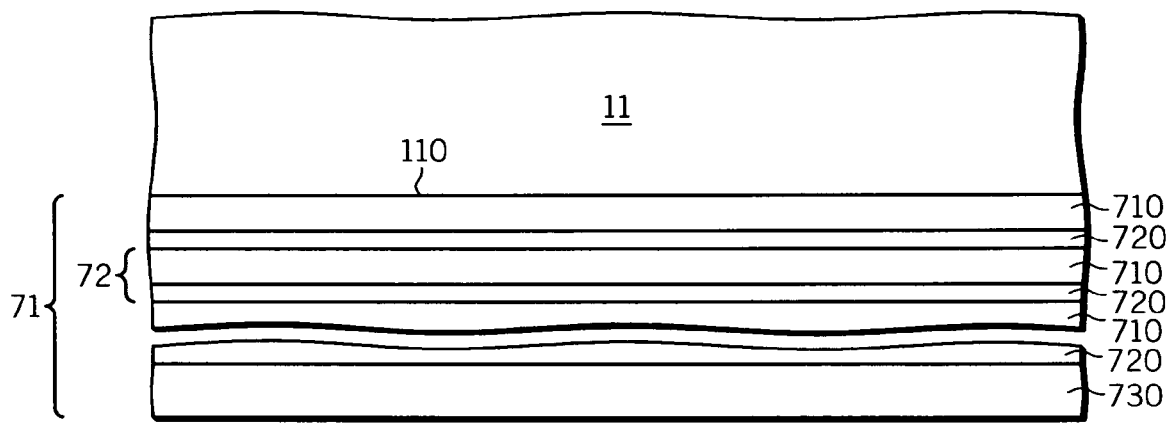
FIG. 4 illustrates an enlarged partial cross-sectional view of a still further embodiment.

FIG. 4 shows an enlarged partial cross-section view of a still further embodiment of a multi-layer extrinsic gettering structure 71 formed overlying major surface 110 of semiconductor substrate 11. In this embodiment, structure 71 comprises alternating layers of polycrystalline semiconductor layers 710 and dielectric layers 720. A first polycrystalline semiconductor layer 710 adjoins or contacts major surface 110 and separates a first dielectric layer 720 from major surface 110. In one embodiment, polycrystalline semiconductor layers 710 comprise polycrystalline silicon, and have thicknesses in range from about 0.01 microns to about 0.5 microns. In one embodiment, dielectric layers 720 comprise silicon dioxide and have thicknesses in a range from about 0.002 microns to about 0.05 microns. One layer 710 and one layer 720 form a pair of layers 72, and multi-layer structure 71 may have a total of from two (2) to fourteen (14) or more pairs of layers 72. In another embodiment, a second dielectric layer 730 is formed as the outermost layer of multi-layer structure 71, and comprises for example, a low temperature silicon dioxide having a thickness greater than about 0.5 microns. Second dielectric layer 730 is used to reduce autodoping or contamination effects associated with epitaxial reactor susceptors when semiconductor layers such as semiconductor layer 14 (shown in FIG. 1) are grown.

EXAMPLE

In one example, a multi-layer gettering structure 51 (shown in FIG. 2) was deposited on a major surface 110 of a silicon substrate (CZ silicon, antimony doped, <100> orientation, and a resistivity of 0.005-0.018 ohm-cm) using LPCVD deposition techniques. The polycrystalline silicon layers were formed overlying major surface 110 using a silane source, and silicon dioxide layers were formed using a silane source. Layers 510 and 520 were deposited in one deposition tube. The deposition temperature for both layers 510 and 520 was about 640 degrees Celsius. The deposition pressure for the polycrystalline silicon layers was about 13 Pascal (about 0.1 Torr), and the deposition pressure for the silicon dioxide layers was about 20 Pascal (about 0.15 Torr). The silane flow rate for the deposition of polycrystalline layers was about 120 sccm and the silane flow rate for the deposition of the silicon dioxide layers was about 120 sccm with an oxygen flow rate of about 150 sccm. In this example, multi-layer structure 51 comprised 19 alternating layers—ten layers of polycrystalline silicon with each polycrystalline silicon layer separated by a silicon dioxide layer for a total of nine layers of silicon dioxide. In this example, each polycrystalline silicon layer had a thickness of about 0.1 microns, and each silicon dioxide layer had a thickness of about 0.008 microns. The total thickness of the multi-layer structure was about 1.072 microns.

After the formation of the multi-layer structure, the Method of Controlled Contamination (MCC) technique was used to assess the gettering capability of the structure. The MCC technique utilizes an intentional contamination of a semiconductor wafer with nickel using a solution of $Ni(NO_3)_2$ before the semiconductor wafer is heat treated. Selective etching is then used to evaluate any haze formed on the front or active side of the semiconductor wafer. The gettering capability of a structure is determined by evaluating the amount of haze formed on the wafer front side as a consequence of wafer contamination with nickel of certain surface concentration. A structure with good gettering capability produces minimal haze at the wafer front side.

Figure 5:
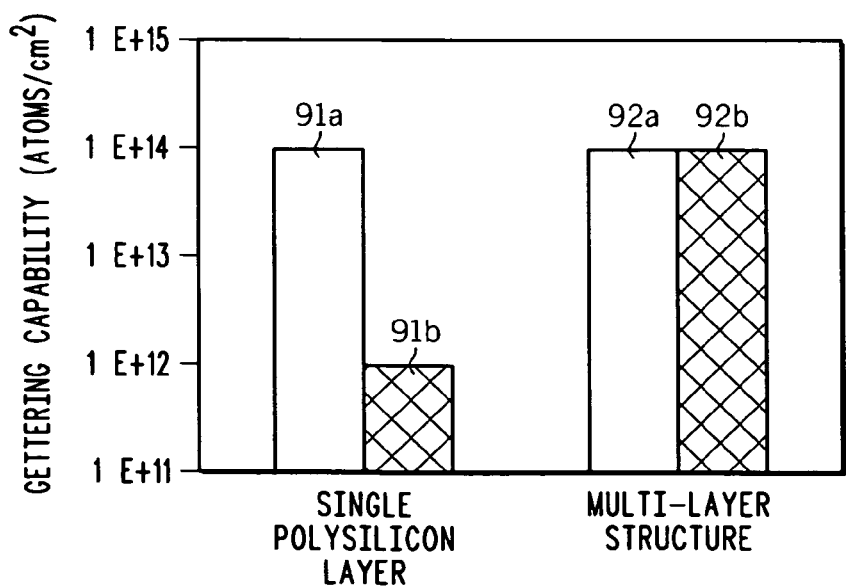
FIG. 5 illustrates a graph showing the gettering capability of a structure described herein compared to a prior art structure.

In the present example, the MCC method showed that the multi-layer structure described herein immediately after it was formed had a gettering capability of 1E+14 atoms/$cm^2$ of Ni. After high temperature annealing (5 hours at 1100 degrees Celsius) the multi-layer structure did not lose its gettering capability. The gettering capability of a single 0.1 micron polycrystalline silicon layer on the same type of substrate showed a gettering capability of 1E+14 atoms/cm2 of Ni, but after high temperature annealing (5 hours at 1100 degrees Celsius), the gettering capability of the single polycrystalline layer dropped to 1E+12 atoms/$cm^2$. This drop in gettering capability is believed to result because during the first high temperature process, the single polycrystalline silicon layer partially recrystallizes and thus loses a great part of its gettering capability. Therefore, the multi-layer gettering structure described herein enhances the gettering capability by about two orders of magnitude as measured by the MCC technique. This result is show graphically in FIG. 5, where the single polycrystalline silicon layer is shown as bar 91*a* before annealing and bar 91*b* after annealing, and the multi-layer structure is shown as bar 92*a* before annealing and 92*b* after annealing.

In summary, an extrinsic gettering structure has been described that includes a plurality of polycrystalline semiconductor layers formed overlying a major surface of a semiconductor substrate. A plurality of dielectric layers is interspersed between polycrystalline semiconductor layers. In a gettering method, the semiconductor substrate is then exposed to high temperature, and the multi-layer structure provides a reliable method for removing unwanted impurities and prevention of formation of impurity related defects. The multi-layer gettering structure maintains its gettering capability even after multiple high temperature processing steps.

Although the invention has been described and illustrated with reference to specific embodiments thereof, it is not intended that the invention be limited to these illustrative embodiments. Those skilled in the art will recognize that modifications and variations can be made without departing from the spirit of the invention. Therefore, it is intended that this invention encompass all such variations and modifications as fall within the scope of the appended claims.

We claim:

1. A method of forming a semiconductor structure comprising the steps of:
   providing a semiconductor substrate having a first major surface; and
   forming a multi-layer structure overlying the first major surface comprising the steps of:
   a. forming a polycrystalline semiconductor layer overlying the first major surface;
   b. forming a dielectric layer overlying the first polycrystalline semiconductor layer; and
   c. repeating steps a and b at least once; and
   exposing the semiconductor substrate to an elevated temperature while using the multi-layer structure to getter unwanted impurities from within at least a portion of the semiconductor substrate.

2. The method of claim 1 further comprising the step of forming a first dielectric layer contacting the first major surface before forming any polycrystalline semiconductor layers.

3. The method of claim 1, wherein the step of repeating steps a and b includes repeating steps a and b from one to twenty seven times.

4. The method of claim 1, wherein the step of forming the polycrystalline semiconductor layer includes forming a polycrystalline silicon layer.

5. The method of claim 4 wherein the step of forming the polycrystalline silicon layer includes forming a polycrystalline silicon layer having a thickness in a range from about 0.01 microns to about 0.5 microns.

6. The method of claim 5, wherein the step of forming the polycrystalline silicon layer includes forming a low pressure chemical vapor deposited polycrystalline silicon layer at a temperature in a range from about 550 degrees Celsius to about 750 degrees Celsius.

7. The method of claim 1, wherein the step of forming the dielectric layer comprises forming an oxide layer.

8. The method of claim 7, wherein the step of forming the oxide layer comprises forming a silicon dioxide layer having a thickness in a range from about 0.002 microns to about 0.05 microns.

9. A method of forming a semiconductor structure comprising the steps of:
   providing a semiconductor substrate having a first major surface;

then in either order:
1. forming a polycrystalline semiconductor layer overlying the first major surface;
2. forming a dielectric layer overlying the first major surface; and
repeating steps 1 and 2 at least once; and
exposing the semiconductor substrate to a temperature sufficient to getter the semiconductor substrate.

10. The method of claim 9 wherein the step of forming the dielectric layer includes forming an oxide layer.

11. The method of claim 9, wherein the step of forming the polycrystalline semiconductor layer includes forming a polysilicon layer.

12. The method of claim 9 further comprising the step of forming a semiconductor device on a second major surface of the semiconductor substrate opposite the first major surface.

13. A process for forming a semiconductor structure comprising the steps of:
providing a semiconductor substrate having a major surface;
forming a first pair of layers overlying the first major surface, wherein one layer comprises a polycrystalline semiconductor material and one layer comprises a dielectric material;
forming a second pair of layers overlying the first pair, wherein one layer comprises the polycrystalline semiconductor material and one layer comprises the dielectric material, wherein the first and second pairs form a multi-layer structure; and
using the multi-layer structure to getter the semiconductor substrate.

14. The process of claim 13, wherein the step of forming the first pair of layers includes in either order:
forming a polysilicon layer overlying the major surface; and
forming an oxide layer overlying the major surface.

15. The process of claim 14, wherein the step of forming the first pair of layers includes forming the first pair of layers in a low pressure chemical vapor deposition apparatus.

16. The process of claim 15 wherein the first pair of layers is formed in a single apparatus.

17. A method for forming a semiconductor device comprising the steps of:
providing a semiconductor substrate having a first major surface, a second major surface opposite the first major surface, and an extrinsic gettering structure formed overlying the first major surface, wherein the extrinsic gettering structure includes a multi-layer structure that comprises alternating layers of a polycrystalline semiconductor material and a dielectric material, and wherein the multi-layer structure comprises at least two pairs of alternating layers;
exposing the semiconductor substrate and the multi-layer structure to an elevated temperature, wherein the exposing step getters the semiconductor substrate; and
forming a semiconductor device in proximity to the second major surface.

18. The method of claim 17, wherein the step of providing the semiconductor substrate includes providing the semiconductor substrate with an extrinsic gettering structure that comprises alternating layers of polysilicon and silicon oxide.

19. The method of claim 18, wherein the step of providing the semiconductor substrate includes providing the semiconductor substrate with an extrinsic gettering structure that comprises from two to fourteen pairs.

20. The method of claim 17, wherein the step of providing the semiconductor substrate includes providing the semiconductor substrate with an extrinsic gettering structure having a dielectric layer as a first layer adjacent the first major surface.

* * * * *